(12) United States Patent
Hurrell et al.

(10) Patent No.: US 7,944,386 B2
(45) Date of Patent: May 17, 2011

(54) APPARATUS FOR AND METHOD OF PERFORMING AN ANALOG TO DIGITAL CONVERSION

(75) Inventors: Christopher Peter Hurrell, Berkshire (GB); Colin G Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 10 days.

(21) Appl. No.: 12/255,359

(22) Filed: Oct. 21, 2008

(65) Prior Publication Data

US 2010/0097256 A1  Apr. 22, 2010

(51) Int. Cl.
*H03M 1/12* (2006.01)

(52) U.S. Cl. .................. 341/155; 341/143; 341/156

(58) Field of Classification Search .............. 341/143, 341/155, 172, 163, 120, 156
See application file for complete search history.

(56) References Cited

U.S. PATENT DOCUMENTS

| | | | | |
|---|---|---|---|---|
| 5,675,340 | A * | 10/1997 | Hester et al. | 341/156 |
| 5,936,562 | A | 8/1999 | Brooks et al. | |
| 5,982,313 | A | 11/1999 | Brooks et al. | |
| 6,400,302 | B1 * | 6/2002 | Amazeen et al. | 341/172 |
| 6,489,913 | B1 | 12/2002 | Hansen et al. | |
| 6,686,865 | B2 * | 2/2004 | Confalonieri et al. | 341/172 |
| 6,707,403 | B1 * | 3/2004 | Hurrell | 341/120 |
| 6,762,707 | B2 * | 7/2004 | Wolf et al. | 341/155 |
| 6,891,490 | B2 * | 5/2005 | Hales | 341/155 |
| 7,129,874 | B2 * | 10/2006 | Bjornsen | 341/143 |
| 7,158,070 | B1 * | 1/2007 | Yang et al. | 341/163 |
| 7,439,892 | B1 * | 10/2008 | Schneider et al. | 341/143 |
| 2002/0105451 | A1 | 8/2002 | Gulati et al. | |
| 2004/0034499 | A1 | 2/2004 | Regier | |
| 2005/0057384 | A1 | 3/2005 | Chen et al. | |
| 2006/0187106 | A1 * | 8/2006 | Mitra et al. | 341/155 |
| 2007/0035431 | A1 | 2/2007 | Hurrell et al. | |
| 2008/0079622 | A1 | 4/2008 | Dura et al. | |

FOREIGN PATENT DOCUMENTS

| | | |
|---|---|---|
| EP | 1193880 | 4/2002 |
| JP | 2001 004681 | 1/2001 |
| WO | WO2005/107077 | 11/2005 |

OTHER PUBLICATIONS

PCT International Search Report and Written Opinion for PCT/US2009/061160 mailed on Aug. 2, 2010.
Lee et al. "Reconfigurable analog integrated circuit architecture based on switched-capacitor techniques", Innovative Systems in Silicon, 1996, International Conference, Oct. 9, 1996, pp. 148-158.
Comino et al., "A First-Order Current-Steering Sigma-Delta Modulator" IEEE Journal of Solid-State Circuits, 26 (3):176-183, 1991.

* cited by examiner

*Primary Examiner* — Jean B Jeanglaude (74) *Attorney, Agent, or Firm* — Kenyon & Kenyon LLP (57) ABSTRACT

An analog to digital converter, comprising a first converter adapted to perform a first, more significant, part of a conversion as a successive approximation conversion, a pipeline conversion or a flash conversion to generate a first conversion result and a residue. The ADC also comprising a second converter adapted to perform a second, least significant, part of the conversion as a sigma-delta conversion by sampling the residue to generate a second conversion result, and a processor adapted to combine the first conversion result and the second conversion result to generate a final conversion result.

26 Claims, 6 Drawing Sheets

APPARATUS FOR AND METHOD OF PERFORMING AN ANALOG TO DIGITAL CONVERSION

FIELD OF THE INVENTION

The present invention relates to an apparatus for and method of performing an analog to digital conversion.

BACKGROUND OF THE INVENTION

The need to convert analog signals into the digital domain has resulted in various analog to digital converter technologies. One of the most successful has been the switched capacitor array successive approximation converter. The most common variant of this converter performs a binary search through a search space. The converter searches through the search space very quickly but requires multiple capacitors to be provided and be carefully weighted with respect to one another. Care has to be taken to maintain linearity.

Another converter type which has found favour, especially in audio applications, is the sigma-delta converter. This often uses a single bit digital to analog converter to provide a coarse signal which is subtracted from the analog signal to be converted, the resulting difference signal is integrated and the integrated signal is quantised, typically by a 1 bit quantiser, whose output either is or is used to drive the digital to analog converter. As only a single bit DAC is used, then errors due to internal mismatch are much reduced compared to a successive approximation converter. The downside is that for a given Nyquist frequency the sigma-delta converter must be clocked much more quickly.

It has been noted that, as the successive approximation routine, SAR, conversion approaches the least significant bit then noise and quantisation errors can become significant. WO2007/021600 describes a SAR converter where following completion of a full conversion, the last few bit trials are re-done, each as an independent SAR conversion and the results are averaged. In each of the re-done SAR conversions the conversion is effectively independent of any preceding or succeeding conversion. Thus, if there are any integrators in the SAR decision making chain, the or each integrator is reset for each bit trial.

SUMMARY OF THE INVENTION

According to a first aspect of the present invention there is provided an analog to digital converter adapted to perform a first, more significant, part of a conversion as a successive approximation conversion, a pipeline conversion or a flash conversion and a second, least significant, part of a conversion as a sigma-delta conversion.

It is thus possible to provide an analog to digital converter which exhibits the rapid search performance, for example, of a successive approximation converter and the superior performance in the presence of noise that a sigma-delta converter provides.

In a preferred embodiment the analog to digital converter comprises at least one switched capacitor array. The switched capacitor array can be regarded as being a digital to analog converter, DAC. Switched capacitor arrays are well known to the person skilled in the art and typically, but not necessarily, comprise binary weighted capacitors. The capacitors are selectively switched to a reference voltage to cause the voltage at an output node of the switched capacitor array to vary on a bit trial by bit trial basis. The resulting voltage can be compared with a reference so as to determine whether the bit weight under investigation should be kept or rejected. Once a bit trial has been performed, the converter moves on to the next bit which has half the significance of the preceding bit and the next capacitor (whose capacitance is half of the preceding capacitor) is connected to the reference and so on. The capacitor array, and its associated switches, are real components and hence are a source of thermal noise. Similarly, the converter may receive noise on its power and/or voltage reference lines. Noise can adversely effect the decisions made by the analog to digital converter.

Advantageously an integrator is provided for receiving the output from the switched capacitor array and for integrating it. The advantage of using an integrator is that it improves the noise performance of the converter.

Advantageously the output of the integrator is provided to an input of a comparator, or a latch, which acts to determine at a given moment whether or not the bit being trialled as part of the bit trial should be kept or discarded.

In prior art successive approximation converters the integrator is always reset as part of the progression from one bit trial to the next. The inventors realised that the integrator and comparator/latch could be reused in a sigma-delta conversion scheme allowing a second conversion to be performed by the same hardware provided for the successive approximation conversion provided that the integrator is not reset when moving from one trial to the next in the sigma-delta scheme. As noted before, this enables the circuit to combine the advantages of a fast conversion as might be given by a successive approximation converter with the improved noise performance of a sigma-delta converter.

Advantageously when using the switched capacitor array as part of the sigma-delta conversion the same size bit (e.g. same one of the capacitors) is used in each trial. An advantage of using one of the capacitors, for example the least significant capacitor of the switched capacitor array, in the sigma-delta mode is that matching between the successive approximation conversion and the sigma-delta conversion is assured.

Preferably the switched capacitor array is a segmented array. The use of segmented arrays is known to the person skilled in the art, and makes the scaling between the largest and smallest capacitors representing the most significant bit (MSB) and the least significant bit (LSB) much easier to achieve. A downside of this approach is that switching the LSB capacitor as part of the sigma-delta conversion phase can be a source of error because the LSB capacitor is relatively large. Switching it can couple switching transients through the voltage references and perturb the integrator. This is because the voltage references have a finite impedance to the transients introduced by the switching of the capacitors. The transient voltage introduced by switching the LSB capacitor can couple via the voltage references onto the part of the segmented array representing the more significant bits, whereas if the voltage references had zero impedance then any transient would at worst be attenuated by a coupling capacitor located between the segments of the segmented array. This affect of this perturbation can be significantly reduced by inhibiting the integrator during the period when these switching transients could cause unacceptable errors. This can be achieved by various means, such as modifying the current through a current source in the integrator or using current steering to stop current accumulating on an integrating capacitor during a period when integration is to be inhibited.

An additional or alternative approach is to limit the extent to which the transients can propagate through the circuit via the reference lines. Advantageously the first and second sub-arrays of the segmented array have respective reference voltage supplies, for example, at least one or more respective buffer devices driving each of the sub-arrays. This means that any ringing or transients do not propagate back through the reference lines. Similarly any transients propagating through the coupling capacitor which couples the sub-arrays together is attenuated by that capacitor.

In an alternative embodiment a separate digital to analog converter is provided as part of the sigma-delta converter. This has the advantage of enabling the quantiser and/or 1 bit DAC to be optimised for the sigma-delta converter and to be independent of the design considerations or capacitor selections made for the SAR converter. The output of the digital to analog converter can then be summed with a residue value output from the switched capacitor successive approximation converter and then integrated.

Preferably a gain stage is provided at the output of the switched capacitor array so as to amplify the residue voltage prior to providing it to the sigma-delta converter.

According to a second aspect of the present invention there is provided a method of performing an analog to digital conversion, the method comprising the steps of:
a) performing a first part of the conversion using a successive approximation conversion process, pipeline conversion process or flash conversion process to obtain a first result;
b) performing a second part of the conversion using a sigma-delta conversion process to obtain a second result; and
c) combining the first and second results to produce an output value.

According to a third aspect of the present invention there is provided an integrator comprising
a first circuit responsive to a first converter residue for forming a ramping voltage difference between first and second nodes of the circuit in response to a first input signal, and
a current steering circuit operable during a sigma-delta analog to digital conversion mode able to modify the gradient of the ramping voltage difference between the first and second nodes of the circuit.

BRIEF DESCRIPTION OF THE DRAWINGS

Preferred embodiments of the present invention will now be described, by way of non-limiting example only, with reference to the accompanying drawings, in which.

DESCRIPTION OF PREFERRED
EMBODIMENTS OF THE INVENTION

The inventors noted that analog to digital converter technology has evolved into distinct streams. Examples of these streams are flash converters, successive approximation converters, pipeline converters and sigma-delta converters. Flash converters are fast, but tend to exhibit low resolution compared to successive approximation routine (SAR) converters and sigma-delta converters. For higher resolutions, e.g. 14 bits and above, the SAR and sigma-delta technologies are the technologies of choice.

Both of these converter technologies are well known to the person skilled in the art and need not be described in detail here.

In broad terms the choice of SAR versus sigma-delta can be based on many parameters, such as linearity, performance in the presence of noise, conversion rate and clock frequency. SAR converters require many fewer clock cycles to come to a result, and hence are preferred on grounds of conversion rate and clock frequency. When considering performance in the presence of noise the decision is far less clear. In general if the limit on accuracy is limited by noise, then the sigma-delta converter ultimately delivers the best performance. If noise is not the limiting factor, then the SAR converter is probably a preferred technology.

The inventors realised that combining the SAR converter and a sigma-delta converter could be advantageous. The SAR converter can be exploited to convert the more significant bits in the analog to digital conversion and a residue representing a difference between the analog value being converted and a 'converted' value obtained in the successive approximation routine process is then passed to a sigma-delta converter such that the residue can also be converted. These results can then be combined to yield a final answer.

Figure 1:
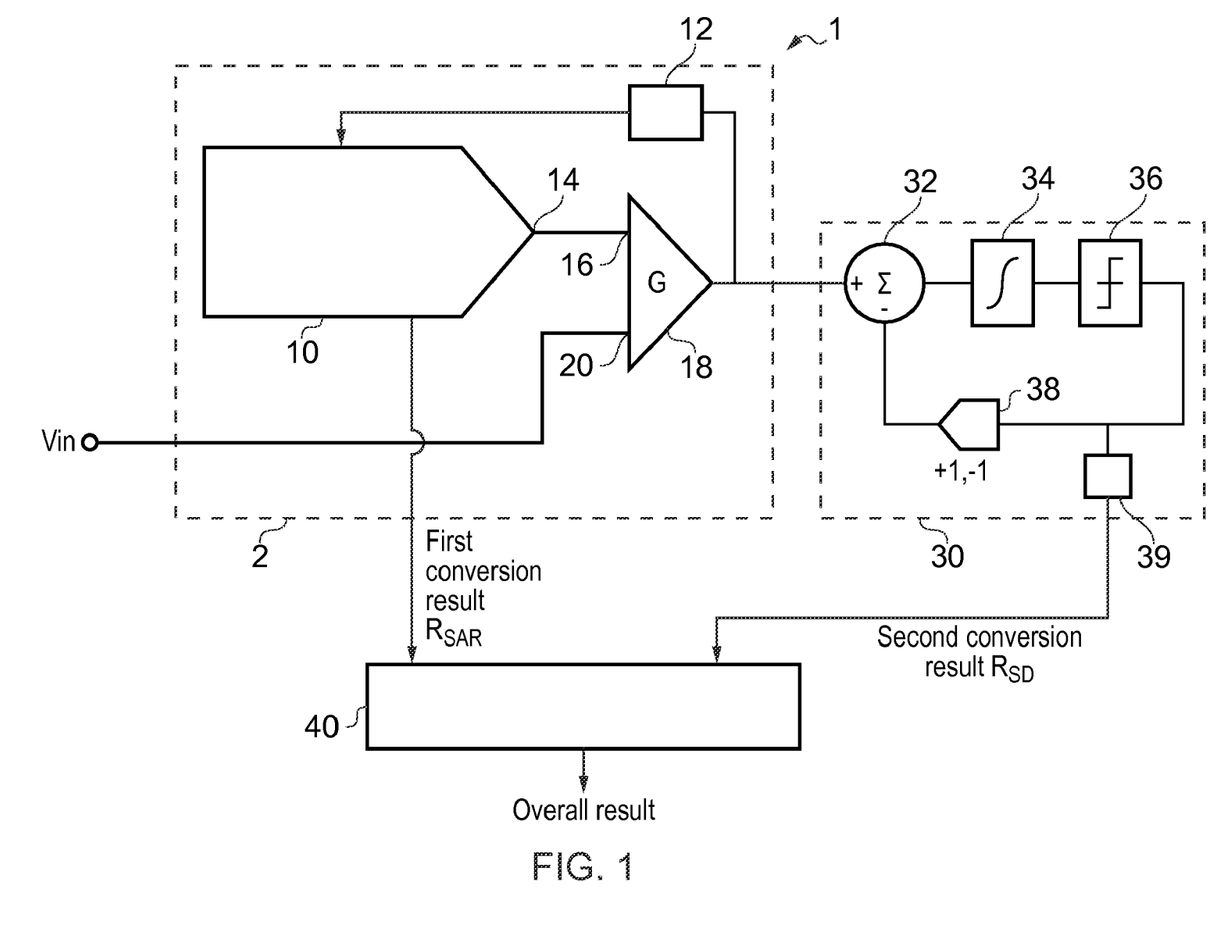
FIG. 1 is a schematic diagram of an analog to digital converter constituting a first embodiment of the present invention.

FIG. 1 schematically illustrates a first embodiment of the invention. The analog to digital converter 1 of FIG. 1 comprises a successive approximation converter 2 which receives an input signal $V_{in}$ and performs a first conversion which in the context of the overall operation of the analog to digital converter 1 can be regarded as finding the more significant bits of the conversion result.

The SAR converter 2 need not be limited to any specific SAR technology, although as will be described later switched capacitor arrays are advantageous.

The SAR converter 2 may be considered as comprising a digital to analog converter 10 responsive to a controller 12. An output 14 of the digital to analog converter 10 is provided to a first input 16 of a differential amplifier 18. A second input 20 of the amplifier 18 receives the signal that is to be converted, $V_{in}$. Advantageously $V_{in}$ has been captured by a sample and hold circuit (not shown). In use the controller 12 commences the SAR algorithm by setting the DAC to half full scale, i.e. 1000 0000 for an 8 bit DAC.

Suppose that $V_{in}$ is 60% of full scale, and that the first input 16 is a non-inverting input and that the second input is an inverting input. At a first bit trial compare step $V_{in}$ is greater than the output the DAC 10, so the output voltage from the amplifier is negative. The controller 12 notes this, and as a result the first bit (the MSB) is kept. For the next trial the $2^{nd}$ bit is set and the $1^{st}$ is kept, so we have 1100 0000, which is ¾ of full scale. Now, at a comparison step the DAC output is greater than $V_{in}$. The output of the amplifier is positive and the controller 12 uses this information to note that bit 2 should be rejected. It can be seen that we only examine the sign of the output of the amplifier, so the input to the controller is effectively a digital signal. Thus so far we know the comparison result is 10XX XXXX, where X represents bits yet to be trialled. The trial commences to the third bit trial of 1010 0000, which is ⅝ full scale (62.5%) so bit 3 will not be kept, and so on, until all of the bit trials of the DAC 10 in the SAR converter 2 have been performed.

The controller 12 and/or DAC 10 can be examined to obtain a first conversion result which is a digital word $R_{SAR}$ representing the output voltage $V_{SAR}$ at the output 14 of the DAC 10.

Due to the inherent fact that the result is quantised there is likely to be a difference between $V_{in}$ and $V_{SAR}$, even if the conversion process was flawless. Real devices suffer from artefacts that mean the conversion process is not flawless, and this will be discussed later.

It can be seen that, with the SAR conversion completed the amplifier 18 forms a difference $G(V_{SAR}-V_{in})$ where G is the gain of the amplifier (it can be unity) and this value, which is known as a residue, is passed to a sigma-delta converter 30 which works to form a second conversion result which is indicative of the least significant part in an overall conversion result provided by the analog to digital converter 1.

The sigma-delta converter 30 comprises a summer 32 which receives the residue at an adding input thereof. An output of the summer 32 is provided to an integrator 34 who's output is provided to an input of, in this example, a 1-bit quantiser 36. Sigma-delta converters having multi-bit quantisers and higher order converters are known and can be used here, but the single bit quantiser will be discussed as it represents the simplest form of a sigma-delta converter. The output of the quantiser 30 is in this example provided to a 1 bit DAC 38 which has an output connected to a subtracting input of the summer 32.

In use, the sigma-delta converter 30 is clocked, to force the quantiser to make a decision, and this results in a 1 or 0 output from the quantiser at each clock. Multiple clocking of the quantiser generates a bit stream which can be processed by a decimation filler 39 to produce a very precise result Rsd. The stream of "1" and "0" is also used to control the DAC 38 to produce a +V or −V output as is known to the person skilled in the art. This result from the sigma-delta converter can be regarded as a second conversion result $R_{SD}$ which can be combined with the first conversion result to obtain an overall result at a result processor 40. The results from the sigma-delta converter might simply be summed with the SAR result to obtain a final result.

As noted earlier, a switched capacitor architecture within the SAR converter 2 is a preferred implementation. This is because the same switched capacitor array, an example of which is shown in FIG. 2, can be used as a DAC, as a sampling and hold device, and as a difference calculator to find the difference between $V_{in}$ and $V_{SAR}$.

Figure 2:
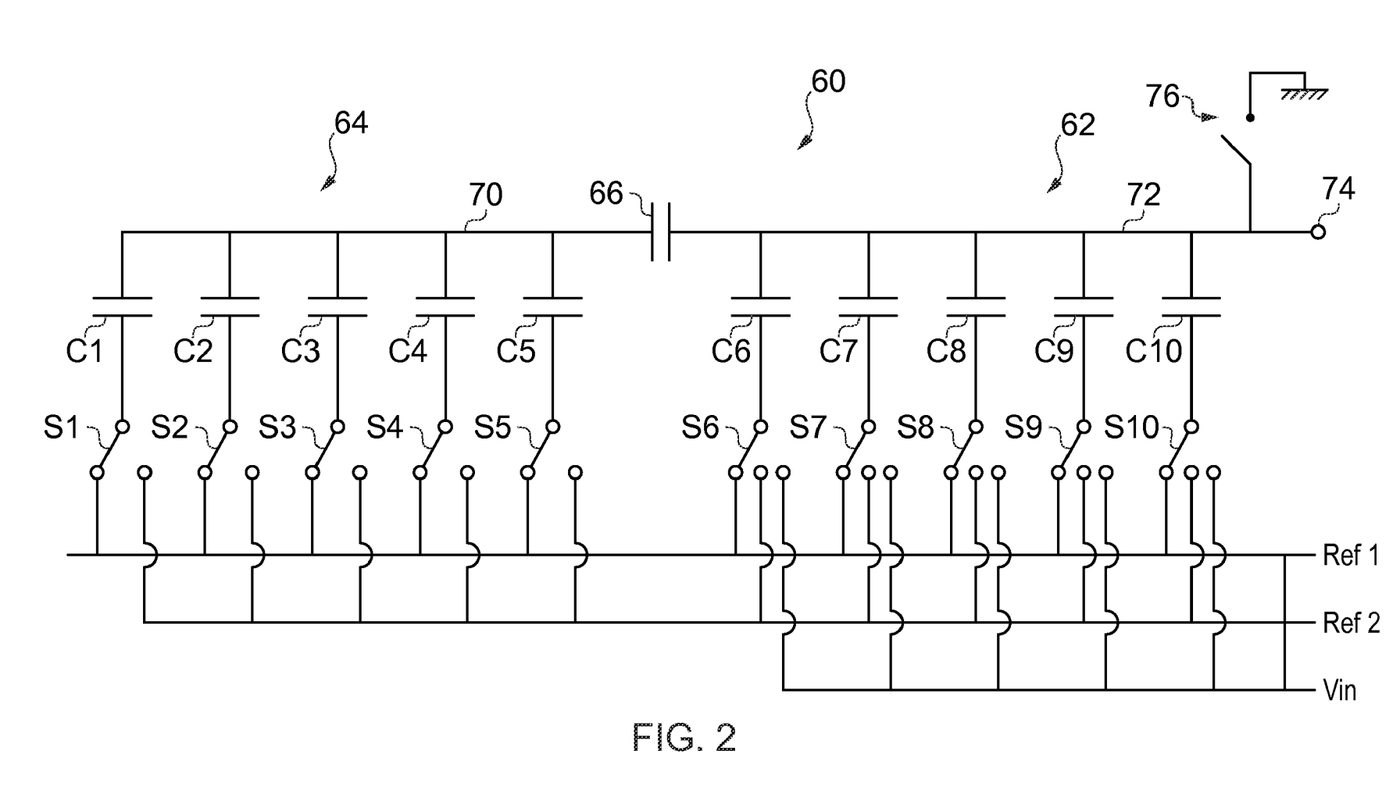
FIG. 2 shows a switched capacitor array for use in an embodiment of the invention.

FIG. 2 schematically illustrates a segmented switched capacitor array. For simplicity the array 60 only comprises 10 bit trial capacitors C1 to C10 although it is to be understood that more capacitors are provided in SAR converters having greater than 10 bit accuracy.

In this 10 bit example C1 represents the least significant bit and C10 represents the most significant bit. The bit weights are binary weighted, but it should be noted that binary weighting, i.e. radix=2, is not essential and converter technologies with radix<2, e.g. around 1.7 or 1.8, are known and can be used.

If the converter were not segmented, then C10 would be $2^{10}=1024$ times C1. This scaling gets significantly worse with higher precision SAR converters. However by segmenting the switched capacitor array 60 into a first and second sub-arrays 62 and 64 respectively separated by a coupling capacitor 66 then each array can be resealed such that C1=1 unit, C2=2 units of capacitance, C3=4 units, C4=8 units, C5=16 units, then C6=1 unit, C7=2 units, C8=4 units and so on. This significantly simplifies the manufacture of the SAR converter whilst still preserving the relative weights of the bit trials, i.e. MSB=$2^{10}$ LSB.

The capacitors C1 to C10 can be regarded as having "top plates" and "bottom plates". The top plates of C1 to C5 are connected to conductor 70, while the top plates of C6 to C10 are connected to conductor 72. Conductors 70 and 72 are coupled together via the coupling capacitor 66, and an output node 74 is connected to the conductor 72. A sampling switch 76 is also connected to the conductor 72 and can be used to hold the conductor 72 and hence the top plates of C6 to C10 to a reference voltage, such as ground, during an acquisition (often called sampling) phase.

Each of the bottom plates is associated with a respective switch S1 to S10, which in practice are formed by transistors as is known to the person skilled in the art.

Switches S1 to S5 are two position switches that can selectively be used to connect the bottom plates of their associated capacitor to either a first reference voltage, Ref 1 or a second reference voltage Ref 2. Often one of these is ground (0 volts).

Switches S6 to S10 are three position switches which can be used to connect to bottom plates to the first reference voltage Ref 1, the second reference voltage Ref 2 or to $V_{in}$, the latter being an option during an acquisition phase, such as sampling the input.

The action of this array is well known, so only a brief summary will be given here. During an acquisition/sampling phase the sampling switch 76 is closed and switches S6 to S10 are set to connect the bottom plates of their respective capacitors to $V_{in}$. The switches S1 to S5 are typically set to one of the reference voltages, such as Ref 2 where Ref 2 corresponds to ground. The capacitors C6 to C10 charge up such that they have $V_{in}$ across their terminals. Then the sampling switch 76 is opened capturing the charge on the capacitors C6 to C10.

In a bit trial phase the capacitor switches are all set to Ref 2 (0 volts), then S10 is set to Ref 1 and after a settling time the voltage at node 74 is compared to 0 volts. The charge redistribution nature of the switch capacitor array is such that each trial forms a difference between $V_{in}$ and $V_{DAC}$ where $V_{DAC}$ is the value of the trial word presented to the capacitor array 60 acting as a digital to analog converter. Thus the array automatically forms its own residue. The bit trials progress with each bit being set in turn, tested and as a result of the test of the voltage at node 74 the bit under trial is either kept or rejected.

This process continues until all of the bit trials for the capacitors C10 to C1 have been completed. The resulting value gives the SAR word representing the value of $V_{in}$.

Figure 3:
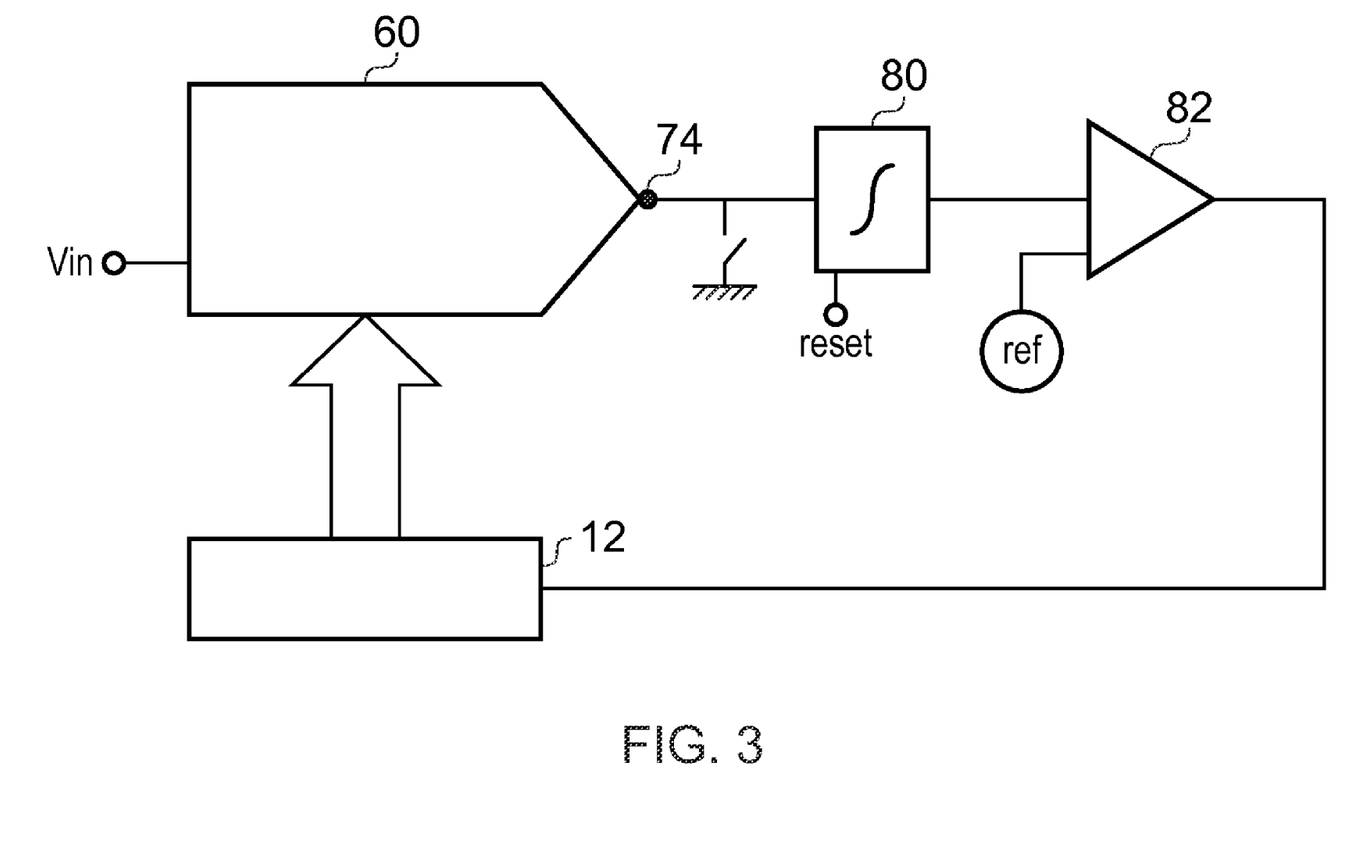
FIG. 3 shows the components of a SAR converter provided after the switched capacitor DAC.

Often the output node 74 does not feed directly to a comparator but, as shown in FIG. 3 is provided as an input to re-settable integrator 80 which is used to integrate the output of the node 74 over a short period of time. The output of the resettable integrator 80 is then provided to the comparator 82, who's output is provided to the SAR controller 12. Resetting of the integrator can also be achieved by changing its time constant, and making the integrator "leaky". This can be considered as low pass filtering the signal at the output node 74.

The integrator 80 gives the SAR converter improved immunity to noise. At some point during the SAR routine $V_{DAC}$ and $V_{in}$ will be very close to one another. This condition can occur on any one of the bit trials as it depends on the value of $V_{in}$. Noise at this time might increase the risk of a bit being incorrectly kept or incorrectly rejected. Simply providing the output from the switched capacitor array 60 to the comparator 82 would render the result vulnerable to the instantaneous noise power at the comparator at the decision instant. The provision of an integrator 80 reduces this risk as a result of the averaging and gain provided by the integrator 80. Each bit trial requires that the integrator substantially forgets the result of the preceding bit trial, and hence the integrator is reset after the comparator makes its decision, or the time constant of the integrator is set high enough such that the initial value held by the integrator at the beginning of a bit trial decays away to a sufficiently small value at the end of the bit trial not to perturb the operation of the SAR converter.

The inventors noticed that the integrator 80 and comparator 82 are conceptually similar to the integrator and 1 bit quantiser of the sigma-delta converter. They also realised that if a sigma-delta converter engine controlled a switched capacitor array then the switched capacitor array could also act as the DAC and the summer of a sigma-delta converter.

Therefore a combined SAR and sigma-delta analog to digital converter can be built reutilising the components that had already been provided within the SAR converter. Thus improved noise performance can be obtained without having to form significant amounts of extra circuitry within an integrated circuit having an analog to digital converter therein.

In the digital side, the controller 12 needs to be modified so as to be able to run a sigma-delta conversion once the SAR conversion has been completed, and in the analog side the integrator 80 needs a trivial modification to stop it resetting or leaking the integration result away when in the sigma-delta mode.

Returning to FIG. 3, in a first phase of a conversion the switched capacitor array is controlled by the controller 12 to perform a successive approximation conversion for the most significant bits of the conversion. This can be, in this example, bit 1 to 10 (bit 1 is the MSB, bit 10 is the LSB as represented by capacitors C10 and C1, respectively) of the switched capacitor array. During each SAR trial the output from the array 60 is integrated, with the integrator starting from a reset condition (or nearly reset) where the integrator is leaking, and after the integration period a decision is made by the comparator 82 whether to keep or discard the bit. In a second phase the controller 12 drives the circuit to perform a sigma-delta conversion on the value of the residue left on the switched capacitor array after the SAR conversion. The residue may be subjected to gain and level shifting prior to being converted by the sigma-delta converter.

In the sigma-delta regime the controller 12 drives one or more of the least significant bits, e.g. bit 9 and/or 10 corresponding to C1 or C2 of the array. Thus C1 or C2 acts as a feedback DAC of a sigma-delta converter for the purpose of feeding a voltage back to the summer. In order to get the "negative" value corresponding to one of the outputs of the quantiser it may be necessary to synthesise a negative bit weight in the array. This can be done by, for example, having C1 connected to Ref 1 rather than Ref 2 at the sampling instant or by fabricating a further capacitor to synthesise the negative weight by connection to another reference voltage at the sampling instant.

In a dual ended device, i.e. one having two switched capacitor arrays, one connected to the inverting input of the comparator and the other connected to the non-inverting input—via integrators or a differential integrator—then creating a "negative" weight on one array can be achieved by increasing the weight on the other array. Thus no steps need to be taken to synthesise "negative" bit weights in such a device as it can all be handled by modification of the conversion routine at the controller 12.

At each sigma-delta trial the least significant bit is controlled to output +1 or −1—all other bits being left unchanged from the SAR result, and now the output voltage at the node 74 is integrated by the integrator 80 but the reset to the integrator is inhibited when moving from one bit trial to the next (or the time constant of the integrator is significantly increased) such that the integrator integrates over all of the sigma-delta bit trials. At the end of each bit trial the comparator 82 makes a comparison of the integrator output voltage compared to the reference and this determines whether the LSB is set to give +1 or −1 for the next trial. The designer is not constrained to use the LSB in the sigma-delta trial, and may choose to use a different bit weight, such as 2 LSB, 4 LSB or so on.

In one embodiment of the invention, each time the comparator (82) output returns a logic high, the driven node of a capacitor (such as the LSB capacitor) is switched from one reference voltage to another reference voltage so as to change the analog value at the integrator input by a fixed amount with a particular polarity. Conversely, each time the comparator output returns a logic low, a capacitor is switched to create a change at the integrator input of the opposite polarity. The sense of the feedback provided by the comparator and the switched capacitors acts to keep the integrator outputs within a range of values that ensures that the transconductance of the integrator remains acceptably constant.

In a second embodiment of the invention, the capacitor switching arrangement for a single bit sigma delta would result in the integrator input voltage, for a particular conversion, normally switching between just 2 voltage levels. While this can be achieved with more than one capacitor, in its most simple arrangement, a single capacitor is switched to one reference level when the comparator returns a logic 1 and to a different reference voltage when the comparator returns a logic 0.

In an alternative approach avoiding the formation of a "negative" weight at the least significant bit level the controller 12 can increment or decrement the entire word on the capacitor sub-array. This also works, but as the capacitors are real components may give rise to undesirable transients at the node 74.

The very nature of the segmented array gives rise to C1 being relatively large in real terms compared to its size in the bit trials. Switching of C1 in the sigma-delta trial can cause ringing or transient switching noise to propagate to node 74 via the reference voltage line Ref 1 and the capacitors of the first sub-array 62 connected between the node 74 and Ref 1.

Figure 4:
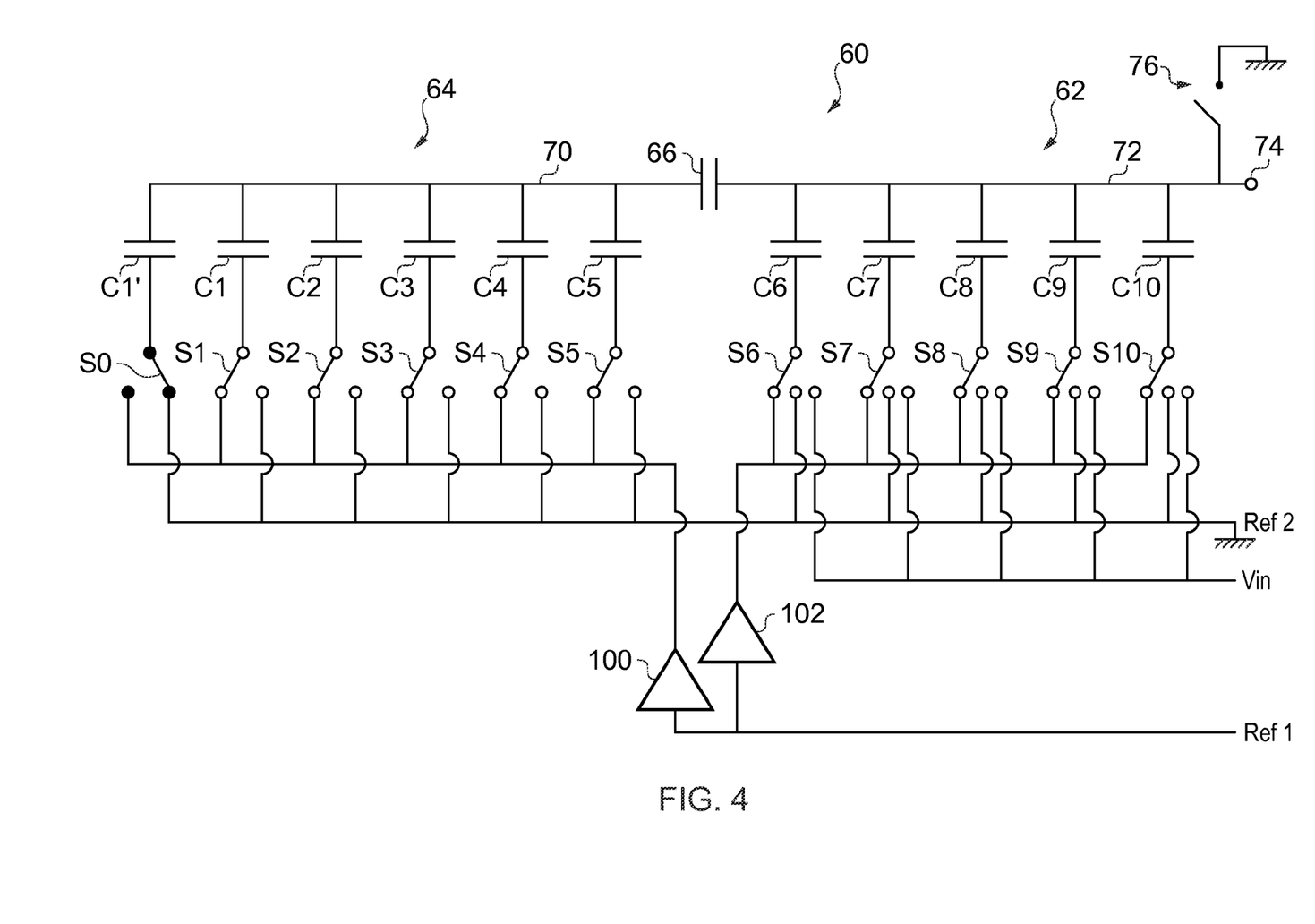
FIG. 4 shows a modified switched capacitor array.

The inventors realised that this gives rise to a significant ringing problem during the sigma-delta conversion phase. One way to overcome this problem is shown in FIG. 4. Here buffers 100 and 102 are provided to isolate the reference voltage in the sub-arrays 62 and 64 from one another. Buffer 102 can be omitted if desired. FIG. 4 also shows the formulation of an additional 1 LSB capacitor C1' with a switch so that, during the sampling phase connects to Ref 1 rather than Ref 2. This allows a negative weight of 1 LSB to be synthesised.

It should be noted that as an alternative approach a feedback DAC can be provided solely for use in the sigma-delta converter, as shown in FIG. 1.

An alternative or additional approach to dealing with the transients is to inhibit the integrator from integrating during the transient period. This can be achieved in a differential integrator by starving an input device or devices of current or steering an output of the input device or devices away from an integrating node or element.

Figure 5:
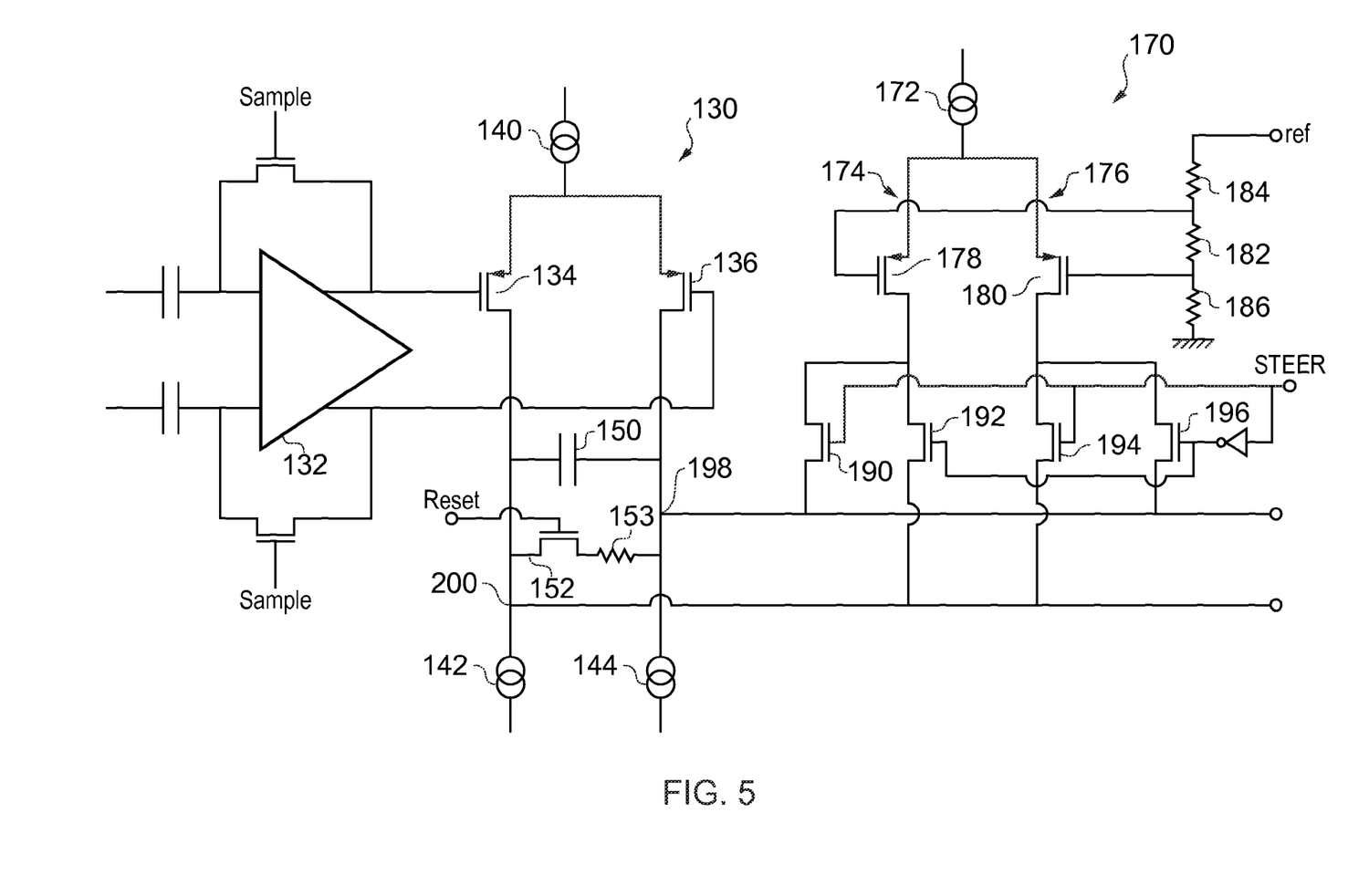
FIG. 5 shows a integrator and current steering DAC that can be used in a sigma-delta converter stage of an embodiment of the present invention.

A preferred approach to implementing the sigma-delta converter stage onto the existing hardware of the SAR converter is to apply a signal from a current steering digital to analog converter to the integrator. FIG. 5 shows an embodiment of a circuit for doing this. Thus the sigma-delta converter uses a digital to analog converter separate from the DAC formed by the switched capacitor array 60.

The integrator, generally designated 130, can optionally be preceded by a differential gain stage 132. Furthermore, the addition of transistors 133a and 133b in a feedback path around the gain stage creates a virtual earth at the gain stage inputs that can be used to define the voltage on the un-driven terminal of the sampling capacitors, node 72 in FIG. 2, during the acquisition phase. Opening switches 133a and 133b samples the input voltage on to the input capacitors. With this arrangement, Switch 76 in FIG. 2 should be omitted. As is well known with such an arrangement, the offset and 1/f noise of this gain stage are sampled on to the input capacitors and/or array at the time of sampling, avoiding any need to separately auto-zero the gain-stage 132 The integrator 130 comprises a pair of field effect transistors 134, 136 connected as a longtail pair, i.e. their sources are connected together, and receiving current from a current source 140. The drain terminals of the transistors 134 and 136 are connected to respective loads 142 and 144, which could be passive (resistive) loads or active loads as shown.

A capacitor 150 extends between the drain terminals of the transistors 134 and 136, and current flow imbalance through the transistors 134 and 136 resulting from differences in the voltages of gates of the transistors 134 and 136, the gates being connected to respective outputs of the amplifier 132, causes a current to flow through the capacitor so as to balance the current through the loads 142 and 144. Consequently the voltage across the capacitor becomes representative of the current imbalance integrated over time. A capacitor need not be fabricated in an integrated circuit because the parasitic capacitance that exists at this position in the circuit is often sufficient.

A transistor 152 is in parallel with the capacitor 150 and can be switched into a conducting state so as to allow the capacitor to be "shorted" out, or at least the charge thereon to redistribute, so as to reset the integrator 130. The transistor 152 may be in series with a resistor 153. This can be used to make the integrator "leaky" when the transistor 152 is on. Thus, rather than having a hard and definite reset, the value of the integrator can leak away at a rate defined by the time constant formed by the capacitance of the capacitor 150 (whether the capacitor is provided as a specific component or is merely a parasitic component) and the resistor 153. When the transistor is not conducting the integrator will have a second time constant as a result of the high—but not infinite—resistances seen across the capacitor, because for example, the active loads 142 and 144 cannot be ideal components. The integrator is therefore suitable for use in a SAR converter stage as well as a sigma-delta stage. It can also be seen that the integrator can be inhibited from integrating if, for example, the gates of transistors 134 and 136 are shorted together then no current imbalance occurs and hence the voltage across the capacitor does not change over time. It can therefore be seen that if ringing is a problem an additional transistor can be provided to connect the gates of transistors 134 and 136 together during a ringing period so as to inhibit integration from occurring during the ringing/transient period.

The integrator 130, and more specifically the capacitor 150 thereof, can also integrate current received from a current steering DAC 170. The current through the DAC is controlled by a current source 172. The matching properties of current mirrors within integrated circuits can be used to ensure that the ratios of the currents introduced by the current mirrors used to form the current sources 140 and 172 are well controlled. If active loads are provided then these can also be formed as current mirrors as is well known by the person skilled in the art. The DAC 170 can be switched off during the SAR conversion by switching off current source 172 or by providing an alternative current path, for example a further transistor, to steer the current away from the capacitor.

Because of process variations it may be desirable to control the relative ratio of current division between limbs 174 and 176 of the current steering DAC 170. To achieve this field effect transistors 178 and 180 are provided with their sources connected together, and to the current source 172. A gate terminal of the transistor 178 is connected to one end of a resistor 182 whereas a gate terminal of the transistor 180 is connected to the other end of the resistor 182. The resistor 182 is the middle resistor in a three resistor potential divider formed by resistors 182, 184 and 186 extending between a reference voltage and ground. Thus the gates of the transistors 178 and 180 can be held at different potentials, by suitable selection of the resistor values and the reference voltage such that the current imbalance between the currents flowing in limbs 174 and 176 can be carefully controlled—or even varied if the reference voltage is provided by a DAC (not shown)—or the "ref" node is connected to a controllable current source.

The current from the current source 172, and the splitting of the current as imposed by transistors 178 and 180 can be steered in response to a control signal "steer" provided by the quantiser 36 via steering switches 190, 192, 194 and 196 which are conveniently implemented as FETs. In response to the quantiser output being a "1" then transistor 190 is switched on, 192 off, 194 on and 196 off. As shown transistor 190 acts as a switch extending between the drain of transistor 178 and a node 198 which is in connection with a first plate of the capacitor. Transistor 192 extends from transistor 178 to a node 200 which is connected to a second place to the capacitor 150. Similarly switches 194 and 196 connect between the drain of the transistor 180 and nodes 200 and 198, respectively. The majority of the DAC current flows through limb 176. When steer is "1" the majority of the current is directed to node 198 and when steer is "0" the majority of the current is directed to node 200. Thus the current from the DAC 130 is summed with current flowing through transistors 134 and 136 and integrated on the capacitor.

During SAR mode the current source 172 is switched off—or the reference removed—so that the DAC 170 has no influence on the SAR result. At each bit trial the transistor 152 is briefly made conducting to reset the integrator. Alternatively where resistor 153 has a non-zero value the time constant of the integrator can be reduced by switching resistor 153 into conduction between nodes 198 and 200. In this preferred implementation transistors 134, 136, 178 and 180 are formed from matched devices operating a the same current density as each other.

During the sigma-delta mode of operation the current source 172 and reference are on, but the transistor 152 is held non-conducting such that the integrator carries the result from one integration performed during one bit trial into the succeeding bit trial.

Thus a separate DAC for use in a sigma-delta conversion phase can be formed at only a very modest increase in component count and merged with the integrator that was already provided for the SAR converter. In this approach the size of the bit trials in the sigma-delta conversion can be modified by changing the resistor values or the reference voltage, or the amount of current in the current service. This allows a trade off between speed and resolution to be achieved.

The switched capacitor array functions as a storage device onto which a charge is sampled. It is advantageous to reduce noise during the sampling phase. This can be done by controlling the spectral density of the noise, as disclosed in WO2005/107077. Here a sampling circuit is adapted to sample a signal onto a capacitor. During the sampling process thermal noise s also sampled onto the capacitor, but the sampling circuit is constructed such that the voltage squared of the thermal noise (often referred to as noise power) sampled onto the capacitor is less than the product of ambient temperature and Boltzmann's constant divided by the capacitance of the sampling capacitor. This document teaches that a circuit is constructed such that the portion of the circuit which dominates the thermal noise spectral density has an effective impedance $Z_{NSD}$, and the portion that dominates the thermal noise bandwidth has an effective impedance $Z_{BW}$. If $Z_{NSD} < Z_{BW}$ then the sampled thermal noise power is less than kT/C, where k is Boltzmanns constant, T is temperature in Kelvin and C is capacitance.

Figure 6:
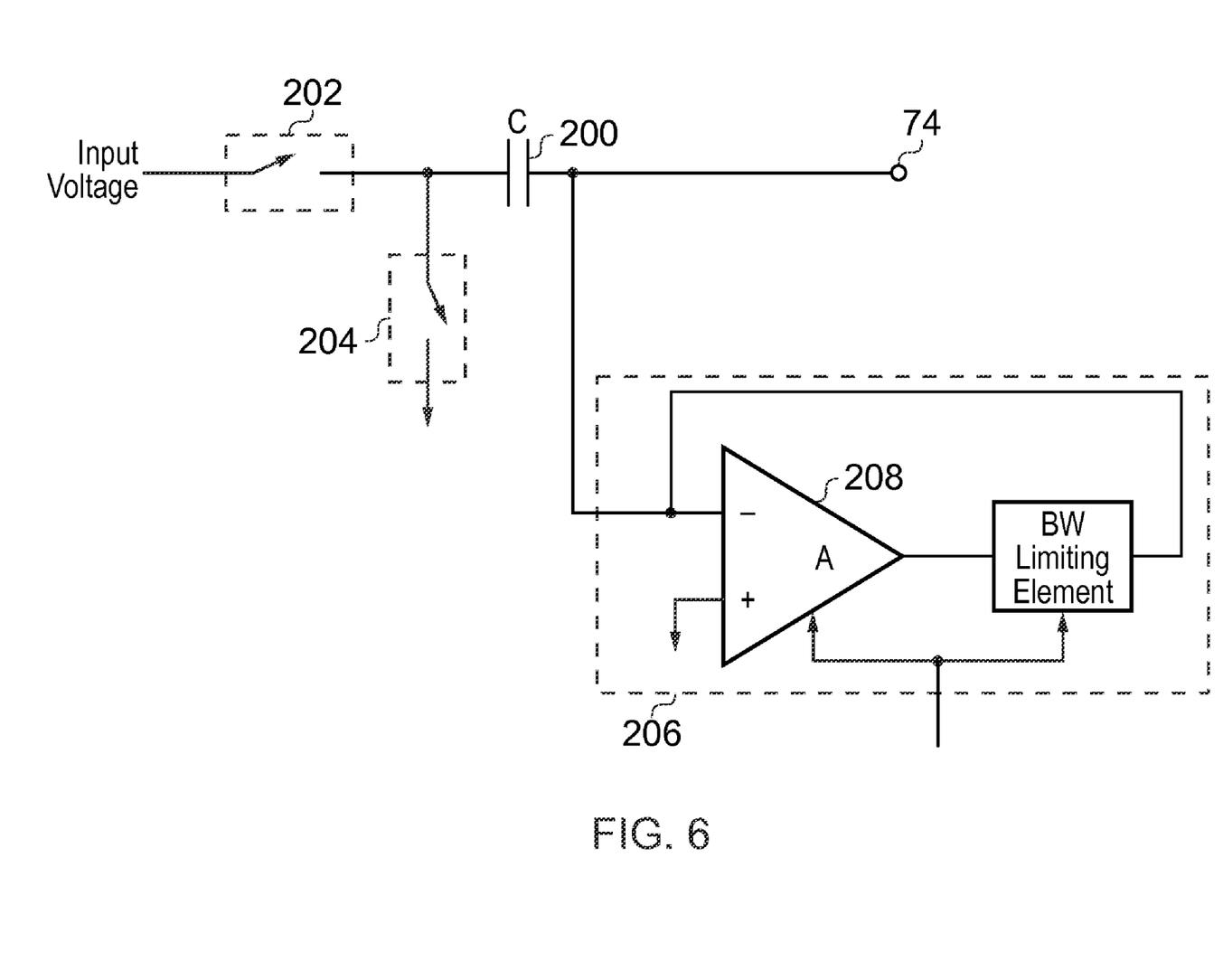
FIG. 6 schematically shows a circuit which can be used in conjunction with the switched capacitor array to reduce sampling noise.

FIG. 6 shows an embodiment of a sample and hold circuit where the switching block can be controlled such that the amplifier therein determines the spectral noise density of the sample circuit. The reader is referred to WO2005/107077 for a further discussion of reducing thermal noise, and the teachings of that document are herewith incorporated by reference. The capacitor 200 represents C5 to C10 in the switched capacitor array of FIG. 2 or 4. Switch 202 is implemented by switches S6 to S10, and switch 204 is implemented by switches S1 to S10. The circuit 206 can be used to form a virtual earth during sampling but, because of the limit in the bandwidth of the feedback circuit around the amplifier 208 then the thermal noise bandwidth can be limited, as discussed more fully in WO2005/107077. In a preferred embodiment the gain stage 132 is constructed in accordance with the teachings of WO2005/107077.

It is thus possible to provide an improved analog to digital converter.

The invention claimed is:

1. An analog to digital converter, comprising:
a first converter adapted to perform a first, more significant, part of a conversion as a successive approximation conversion, a pipeline conversion or a flash conversion to generate a first conversion result and a residue;
a second converter adapted to perform a second, least significant, part of the conversion as a sigma-delta conversion by sampling the residue to generate a second conversion result; and
a processor adapted to combine the first conversion result and the second conversion result to generate a final conversion result.

2. An analog to digital converter as claimed in claim 1, comprising a first switched capacitor array responsive to a controller for performing the first part of the conversion, the array having an output node for providing an output signal which is low pass filtered, integrated, or averaged and compared with a threshold value by a comparator.

3. An analog to digital converter as claimed in claim 2 in which during the second part of the conversion a plurality of trials are performed, wherein an integrated, filtered or averaged value held by the integrator, filter or averager is carried forward when proceeding from one trial to an immediately succeeding trial.

4. An analog to digital converter as claimed in claim 1, in which the converter switches from performing the successive approximation search to performing a sigma-delta conversion after at least one of the following conditions has occurred:
a) a predetermined bit in the bit trial sequence has been trialled;
b) a predetermined number of bit trials have been performed in the successive approximation mode; or
c) the magnitude of a signal at an output node of a switched capacitor array used for sampling an input signal and for performing bit trials in the successive approximation search is below a change over threshold.

5. An analog to digital converter as claimed in claim 2, in which a controller is responsive to the comparator to add or subtract, as appropriate, a value determined by the second part of the conversion from a first conversion result determined in the first part of the conversion.

6. An analog to digital converter as claimed in claim 2, in which during the second part of the conversion the controller switches at least one of the capacitors in the switched capacitor array.

7. An analog to digital converter as claimed in claim 2, in which during the second part of the conversion the controller switches a capacitor or controls a digital to analog converter associated with an integrator used during the second part of the conversion.

8. An analog to digital converter as claimed in claim 1, in which a signal which is a function of a residue from the successive approximation, pipeline or flash analog to digital converter performing the first part of the conversion is passed to a sigma-delta converter which converts the signal as the second part of the conversion, and an arithmetic unit combines conversion results from the successive approximation, pipeline or flash converter and the sigma-delta converter to produce a conversion result.

9. An analog to digital converter as claimed in claim 2, further comprising an integrator arranged to receive the output signal, to integrate it and to supply an integrated signal to a first comparator input of a comparator or a latch circuit, and wherein the integrator has a reset circuit for resetting it and the integrator is reset when moving from a bit trial to a succeeding bit trial when performing a successive approximation conversion, and the integrator is not reset when moving from one trial to a successive trial when performing the sigma-delta conversion.

10. An analog to digital converter as claimed in claim 2, further comprising an integrator or a low pass filter arranged to receive the output signal, to integrate or low pass filter it, and to supply the integrated or low pass filtered signal to an input of a comparator or a latch, and the integrator or low pass filter is arranged to have a first time constant when performing the first part of the conversion and to have a second time constant when performing the sigma-delta conversion, and where the first time constant is smaller than the second time constant.

11. An analog to digital converter as claimed in claim 2, in which the first switched capacitor array is formed from at least a first sub-array and a second sub-array, with the first sub-array capacitively coupled to the second sub-array, and wherein capacitors in the first sub-array are selectively connectable to either first or second reference voltages and capacitors in the second sub-array are selectively connectable to third and fourth reference voltages.

12. An analog to digital converter as claimed in claim 1, further comprising a switched capacitor array responsive to a controller, an integrator, low pass filter or an averager, and a comparator, wherein the controller is arranged to inhibit the integrator, low pass filter or averager during a period following switching of a capacitor in the array.

13. An analog to digital converter as claimed in claim 2 further comprising a digital to analog converter responsive to a comparator for generating a plurality of signal values to be supplied to an input of the integrator.

14. An analog to digital converter as claimed in claim 1, further including a circuit to sample charge onto a capacitor at a temperature, wherein the thermal noise is also sampled on to the capacitor, and the circuit is constructed such that the noise voltage squared of the thermal noise sampled onto the capacitor is less than the product of the temperature and Boltzmann's constant divided by a capacitance of the capacitor.

15. An analog to digital converter as claimed in claim 1, in which when operating in the sigma-delta mode the analog to digital converter is a first order or higher sigma-delta converter.

16. An analog to digital converter comprising a switched capacitor array having a plurality of capacitors of different weights, a controller, an integrator and a comparator, and wherein in a first phase the controller is adapted to operate the switched capacitor array so to perform a successive approximation search, where when moving from bit trial to a subsequent one the value in the integrator is allowed to decay, and then in a second phase to perform multiple bit trials using the same capacitor size for each bit trial, and where when moving from a bit trial to a subsequent one the value in integrator is substantially carried into the subsequent bit trial.

17. A method of performing an analog to digital conversion, the method comprising the steps of:
   a) performing a first part of the conversion using a successive approximation conversion process, a pipeline conversion process or a flash conversion process to obtain a first result and a residue;
   b) performing a second part of the conversion using a sigma-delta conversion process to obtain a second result by sampling the residue; and
   c) combining the first and second results to produce an output value.

18. A method as claimed in claim 17, in which the conversion comprises a plurality of trials and each bit trial includes a compare step for comparing a trial value resulting from the successive approximation conversion or the sigma-delta conversion with a trial threshold, and wherein for the successive approximation conversion the trial value is integrated over a first integration period, and allowed to decay or is reset for a succeeding trial, and during the sigma-delta conversion the integration value from one trial is carried into a subsequent trial.

19. An integrator comprising:
   a first circuit responsive to a first converter residue for forming a ramping voltage difference between first and second nodes of the circuit in response to a first input signal, and
   a current steering circuit operable during a sigma-delta analog to digital conversion mode able to modify the gradient of the ramping voltage difference between the first and second nodes of the circuit.

20. An integrator as claimed in claim 19, in which the first circuit has first and second inputs, and a current in the steering circuit is directed along first and second paths substantially in proportion to a difference between a signal at the first input and a signal at the second input.

21. An integrator as claimed in claim 19, in which an electrically controllable impedance is connected between the first and second nodes such that a time constant of the integrator can be varied.

22. An integrator as claimed in claim 19, in which a capacitance exists between the first and second nodes, and current flow between the nodes gives rise to a voltage difference between the nodes, the voltage difference representing an output of the integrator.

23. An integrator as claimed in claim 19, in which the second current steering circuit is responsive to a digital signal from a comparator or latch such that the gradient of the integrator output ramp changes in response to the digital signal.

24. An integrator as claimed in claim 19, in which during a first successive conversion part of the conversion the logic input to the current steering circuit is inhibited and/or the operation of the current steering circuit is modified so that its output current remains fixed or goes to zero.

25. An analog to digital converter as claimed in claim 1, wherein the second converter samples the residue a plurality of times to generate a plurality of interim values that are averaged to produce the second conversion result.

26. The method as claimed in claim 17, wherein the residue is sampled a plurality of times generating a plurality of interim values that are averaged to obtain the second result.

* * * * *